United States Patent
Blanchard et al.

[11] Patent Number: 6,064,109
[45] Date of Patent: May 16, 2000

[54] BALLAST RESISTANCE FOR PRODUCING VARIED EMITTER CURRENT FLOW ALONG THE EMITTER'S INJECTING EDGE

[75] Inventors: Richard A. Blanchard, Los Altos, Calif.; William P. Imhauser, Ambler, Pa.

[73] Assignee: SGS-Thomson Microelectronics, Inc., Carrollton, Tex.

[21] Appl. No.: 08/475,178

[22] Filed: Jun. 7, 1995

Related U.S. Application Data

[63] Continuation-in-part of application No. 08/222,565, Apr. 4, 1994, Pat. No. 5,444,292, which is a continuation of application No. 07/958,571, Oct. 8, 1992, abandoned.

[51] Int. Cl.[7] .................................................. H01L 27/082
[52] U.S. Cl. ........................... 257/577; 257/578; 257/579
[58] Field of Search ..................................... 257/577, 578, 257/579

[56] References Cited

U.S. PATENT DOCUMENTS

| | | |
|---|---|---|
| 3,619,741 | 11/1971 | Morgan . |
| 4,231,059 | 10/1980 | Hower et al. . |
| 4,411,708 | 10/1983 | Winhan . |
| 4,639,757 | 1/1987 | Shimizu . |
| 4,680,608 | 7/1987 | Tsuzuki et al. . |
| 4,762,804 | 8/1988 | Moors . |
| 5,444,292 | 8/1995 | Imhauser ................................ 257/580 |

FOREIGN PATENT DOCUMENTS

| | | |
|---|---|---|
| 0141075 | 5/1985 | European Pat. Off. . |
| 0239960 | 10/1987 | European Pat. Off. . |

OTHER PUBLICATIONS

D.R. Carley, *Power Transistor Design*, Radio Corporation of America, Components and Devices, Somerville, New Jersey (Apr., 1967).

*Primary Examiner*—Mahshid Saadat
*Assistant Examiner*—George C. Eckert, II
*Attorney, Agent, or Firm*—Theodore E. Galantha; Lisa K. Jorgenson; Allan Ratner

[57] ABSTRACT

A semiconductor device includes an emitter region, a contact region, and a resistive medium. The resistive medium is connected between the contact region and the emitter region. The contact region and the emitter region each include an edge facing each other. At least a portion of the emitter region edge and at least a portion of the contact region edge are non-parallel relative to each other. This configuration enables an emitter ballast resistance to be provided with varied emitter current flow along the injecting edge of the emitter. Furthermore, by including an additional contact and an additional resistive medium between the contacts, the ballast resistance of the semiconductor device can be increased without decreasing the figure of merit of the device.

21 Claims, 6 Drawing Sheets

B=BASE
EP=EMIT./P
EO=EMIT. OP.
P=POLYSILICON
C=CONTACT
M=METAL

B=BASE
EP=EMIT.-P-
EO=EMIT.OPE
P=POLYSILICON
C=CONTACT
M=METAL

BALLAST RESISTANCE FOR PRODUCING VARIED EMITTER CURRENT FLOW ALONG THE EMITTER'S INJECTING EDGE

This Application is a Continuation-in-Part of U.S. patent application Ser. No. 08/222,565, filed Apr. 4, 1994 now U.S. Pat. No. 5,444,292, which is a File Wrapper Continuation Application of Ser. No. 07/958,571, filed Oct. 8, 1992 now abandoned.

FIELD OF THE INVENTION

The present invention relates to semiconductor devices, and more particularly to a semiconductor device which may include an emitter ballast resistance which produces varied emitter current flow along the emitter's injecting edge.

BACKGROUND OF THE INVENTION

As illustrated by FIG. 1, an overlay structure typically includes an emitter stripe with a base contact situated outside of the emitter stripe on either side thereof. The base contacts are fed inwards into the middle of the emitter. On most overlay devices in general use, a polyconductor stripe covers the emitter and makes contact to the emitter. By offsetting this contact in a succeeding layer, a lateral ballasting effect is obtained. This offset may be obtained by placing a polyresistor layer between the contact and the polyresistor stripe. Current then flows through the contact, through the polyresistor layer, and into the emitter contact.

High-current handling transistors are subject to the phenomenon of second breakdown. Second breakdown occurs when, due to a non-uniform current distribution over the emitter zones ("current crowding") the temperature locally increases, as a result of which an avalanche effect is produced which leads to local current concentration and finally to destruction of the transistor.

To avoid this, the emitter zones are provided with emitter series resistors, also designated as ballast or stabilization resistors. These resistors ensure that a uniform distribution of the current over the various emitter zones is obtained due to the fact that upon increase of the current across an emitter zone the voltage drop across the series resistor connected thereto increases, as a result of which the current through this emitter zone decreases.

Various methods are known by which these emitter series resistors can be realized. For example, U.S. Pat. No. 3,896,475 discloses a well known method, according to which a common strip-shaped semiconductor resistance region of the same conductivity type as the base zone is used, which forms a pn junction with the collector region. The series resistor associated with a given emitter zone is then formed by the material of the resistance region present between the connection with the relevant emitter electrode and the connection with the connection conductor. By increasing the dimensions of the resistance region, the ballast resistance in turn is increased.

Although ballast resistors help to avoid second breakdown, the width of the ballast resistors shown in FIG. 1 (i.e., the distance between the edge of the contact region and the edge of the emitter region) is the same fixed value along the entire length of every emitter. The use of a fixed ballast resistor width does not take advantage of the opportunity to optimize the current flow through the emitter of the transistor.

Several conditions can exist that prevent the emitter current flow from being optimum. These conditions include end-to-end voltage drop along the contact metalization to the emitter and the ballast resistor, effects at the ends of the emitter diffusion region, and thermal effect due to power generated during normal transistor operation.

As a result of end-to-end voltage drop along the contact metalization to the emitter and the ballast resistor, emitter base debiasing is obtained. In this manner, the far end of the metalization does not supply as much current as the near end of the metalization. For 26 millivolts of voltage drop, for example, the current is reduced by a factor of 2. Thus, if there is a 26 millivolt drop from end to end of the metalization, the current fall off from end to end will be a factor of 2.

As a result of effects at the ends of the emitter diffusion region, the placement of the ballast resistor relative to the end of the emitter diffusion region may result in the creation of hot spots.

As a result of thermal effects due to power generated during normal transistor operation, the emitter stripe is hotter in the center than at the ends because power can flow out of the ends. Thus, the heat distribution may graphically follow a parabola. This may result in thermal runaway.

It is also known in the semiconductor art that figures of merit may be used to describe the performance of a semiconductor device. One figure of merit of particular interest is defined as the numerical ratio between the emitter periphery (EP) and the base area (BA).

In a semiconductor device operating at high frequencies, low capacitance and hence high current handling capability is particularly desirable. Furthermore, high current handling capability results in high power capability. In order to design a high power, low capacitance device, the emitter periphery is increased as much as possible and the base area is decreased as much as possible. By increasing emitter periphery and decreasing base area, the figure of merit of the device is increased.

Although, it may be desirable to increase the ballast resistance of a device, increasing ballast resistance by increasing the dimensions of the resistance region may have undesirable effects. In particular, to increase the frequency handling capability of a device, the base dimensions may require minimization in order to increase the current handling capability of the device. This is accomplished by reducing the base area of the device to obtain a higher figure of merit. Unfortunately, this reduction results in inadequate room to include ballasting. In other words, by increasing the figure of merit, the maximum ballasting achievable is reduced. Conversely, by increasing the ballasting in a device, the figure of merit decreases.

SUMMARY OF THE INVENTION

A semiconductor device includes an emitter region, a contact region, and a resistive medium. The resistive medium is connected between the contact region and the emitter region. The contact region and the emitter region each include an edge facing each other. At least a portion of the emitter region edge and at least a portion of the contact region edge are non-parallel relative to each other.

DESCRIPTION OF THE DRAWINGS

FIG. 14 is a cross sectional view of a portion of FIG. 15 taken in the plane 14—14.

DETAILED DESCRIPTION

An exemplary embodiment of the present invention will now be described more fully with reference to FIGS. 2a, 2b, and 3–14, in which a semiconductor device is shown during successive stages of manufacture. FIGS. 3–14 show a side view of a relatively large portion of the semiconductor device. FIG. 15 shows a top view of the semiconductor device. These Figures are purely schematic and are not drawn to scale. In particular, the dimensions in the direction of thickness are comparatively strongly exaggerated for the sake of clarity.

Figure 2A:
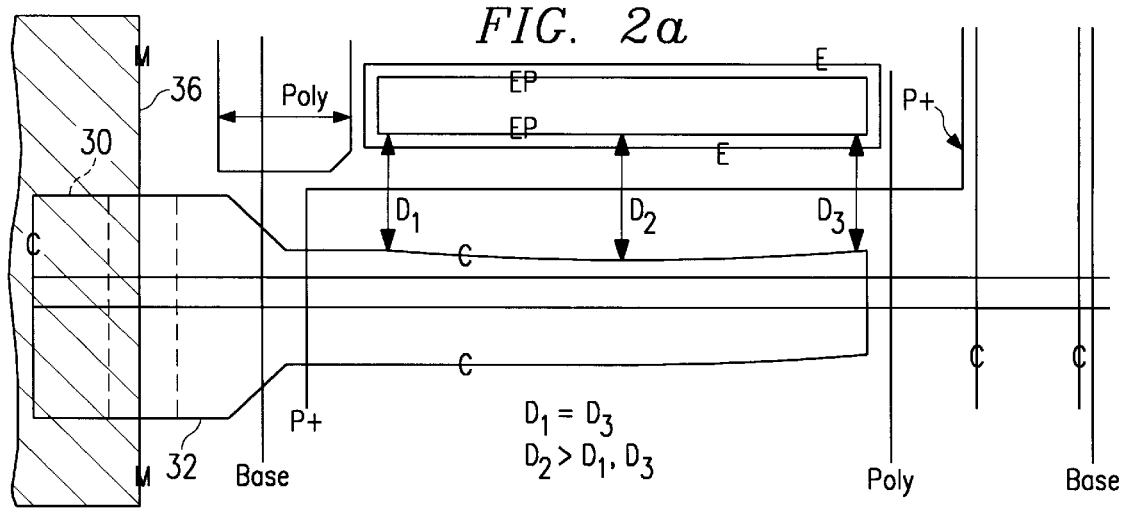
FIGS. 2a, 2b and 2c are top views of a semiconductor devices in accordance with three respective exemplary embodiments of the present invention.
Figure 2B:
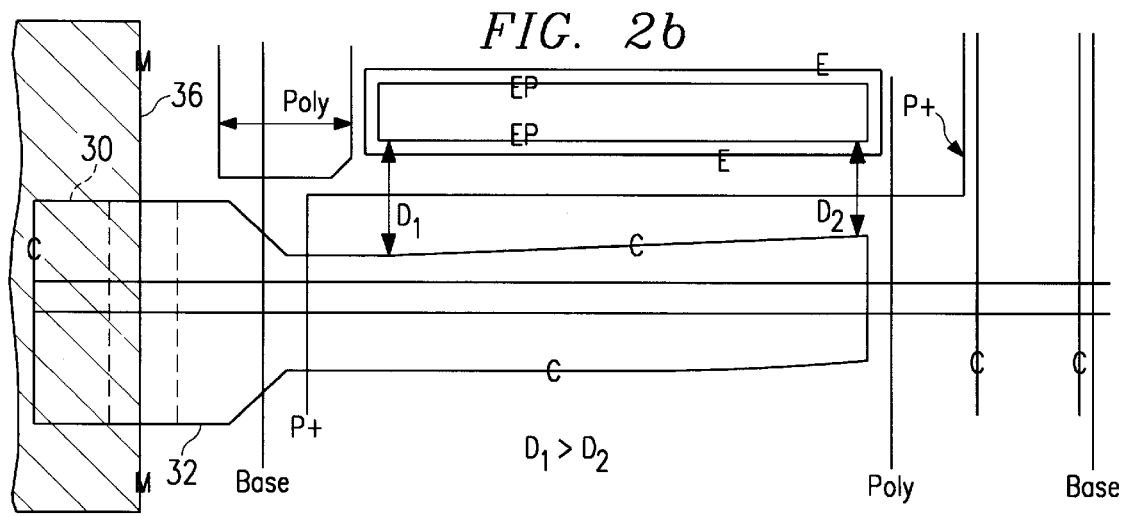
Figure 2C:
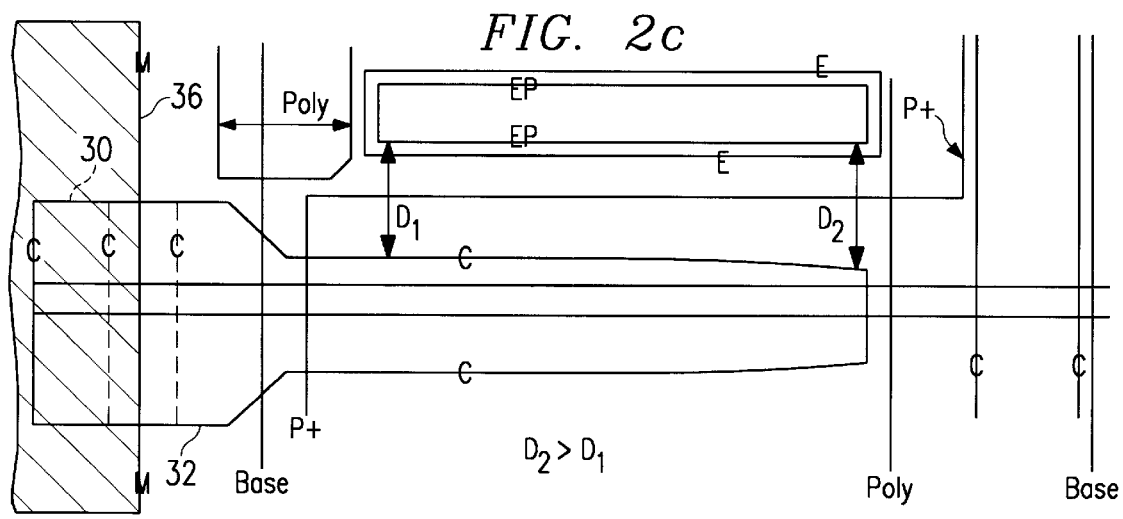

Semiconductor devices in accordance with exemplary embodiments of the present invention are illustrated in FIG. 2a, 2b and 2c. Emitter feeder metal 36 is connected to contact 32. Contact 32 may be comprised of a material such as a silicide. Base feeder metal 35 is also shown. Contact 32 is typically a high conductivity silicide which may be comprised of any of several materials including platinum, titanium, etc. Emitter 33 is also included. Contact 32 is separate from Emitter 33 by polysilicon layer 39. Thus, contact 32, emitter 33 and polysilicon layer 39 collectively may form a single semiconductor device.

In a further exemplary embodiment of the present invention, contact 32 may be shortened and a further contact 30 may be included. In this embodiment, contact 30 is separated from contact 32 by polysilicon layer (or some other resistive medium) 39.

As shown in FIGS. 2a, 2b and 2c, the distance between contact 32 and emitter 33 may vary along the length of contact 32. $D_1$, $D_2$ and $D_3$ are used to indicate dimensions between an edge of contact 32 and the injecting edge of emitter 33 at the place where these identifications appear. In FIG. 2a, $D_1=D_3$ and $D_2>D_1$, $D_3$. This profile reduces current flow in the center of the emitter. In this way, distribution of power dissipation is optimized and hot spots are avoided. In FIG. 2b, $D_1>D_2$. This compensates for end-to-end voltage drop along contact 32. In FIG. 2c, $D_2>D_1$. This compensates for base resistance effects.

Base diffusion layer 34 is shown positioned beneath polysilicon layer 39. Furthermore, emitter 33 is partially buried in base diffusion layer 34. Base diffusion layer 34 is coupled to base feeder metal 35.

Upon the receipt of current by contact 32, current flows from contact 32 to emitter 33 through polysilicon layer 39. To increase the ballast resistance of the semiconductor device formed by contact 32 and emitter 33, the distance between contact 32 and emitter 33 may be increased. Put another way, the ballast resistance may be increased by increasing the amount of polysilicon 39 which is found between contact 32 and emitter 33. Because polysilicon layer 39 is a resistor medium, an increase in the amount of polysilicon through which current must flow from contact 32 to reach emitter 33 will result in increased ballast resistance. Unfortunately, by increasing the distance between contact 32 and emitter 33, the figure of merit of this semiconductor device decreases due to the increased base area.

To increase the ballast resistance without decreasing the figure of merit, contact 30 is optionally provided. For current to reach contact 32, current which is applied to contact 30 first traverses polysilicon layer 39 located between contact 30 and contact 32. If an increase in the ballast resistance of a semiconductor device is desired, the distance between contact 30 and contact 32 is increased. By increasing the distance between contact 30 and contact 32 in this manner, a larger quantity of polysilicon layer 39 is situated between contact 30 and contact 32. By situating a larger amount of polysilicon layer 39 between contact 30 and contact 32, a higher ballast resistance for the semiconductor device is realized. Furthermore, this increased ballast resistance can be maintained without increasing the base area of the semiconductor device. Thus, because the base area of the semiconductor device is not increased, an acceptable figure of merit can be realized, despite the increase in ballast resistance. In addition, the ballast effect (voltage drop) of this resistor is increased due to the increased current flow through this element.

Thus, current travels from emitter feeder metal 36, to contact 30. The current then flows from contact 30 to contact 32 through polysilicon layer 39. Current then flows from contact 32 to emitter 33 by again traversing polysilicon layer 39.

A semiconductor device can be manufactured in accordance with an exemplary embodiment of the present invention, in the following manner.

FIGS. 3–14 are cross sectional views illustrating a method for manufacturing the exemplary embodiment of the present invention illustrated in FIGS. 2a–c.

Figure 3:
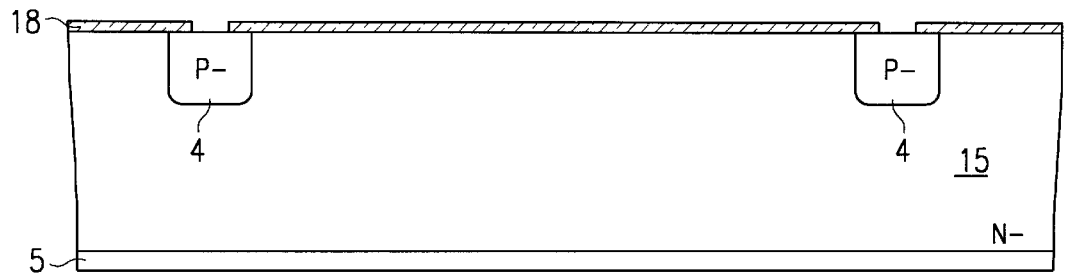
FIGS. 3–14 are side cross sectional views of a semiconductor device at various stages of manufacture in accordance with an exemplary embodiment of the present invention.

As shown in FIG. 3, the starting material is a semiconductor wafer, in this example, epitaxial layer 15 of doped n-type silicon having a resistivity of, for example, 2 ohm cm. Epitaxial layer 15 is located above substrate 5. A base diffusion layer 18 is formed on the top surface of epitaxial layer 15. This base diffusion layer may have a depth of about 0.6 microns. Other depths are possible and will be chosen by those skilled in the art in accordance with existing conditions. Furthermore, P– regions 4 are formed by the implantation of boron ions (dose $5\times10^{12}$ atoms/cm$^3$, energy 100 keV) followed by well known diffusion techniques.

Figure 4:
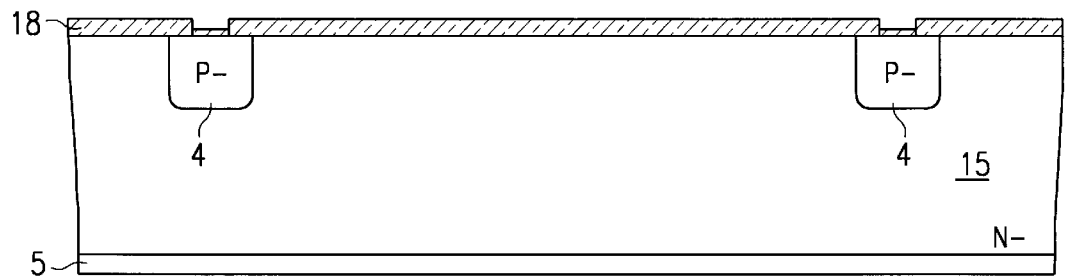

As shown in FIG. 4, the semiconductor device is subjected to a P– drive. This results in the growth of the previously deposited oxide layer, as well as the formation of oxide over the previously exposed portions of P– regions 4.

Figure 5:
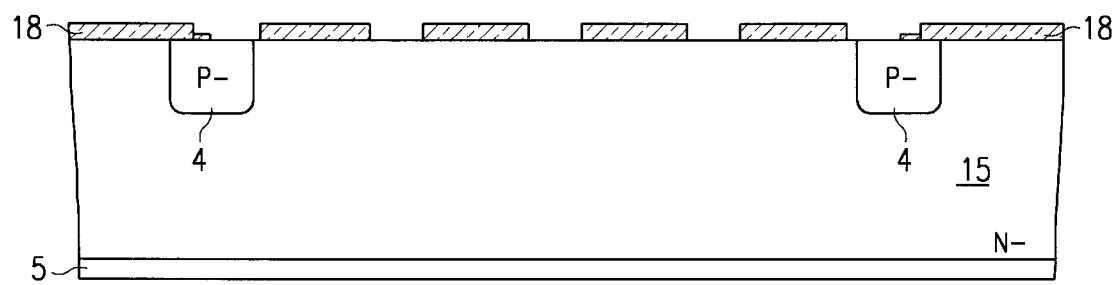

As shown in FIG. 5, portions of oxide layer 18 are removed to expose portions of P– regions 4 and epitaxial layer 15. The removal of portions of oxide layer 18 is accomplished using well known "mask and etch" technology.

Figure 6:
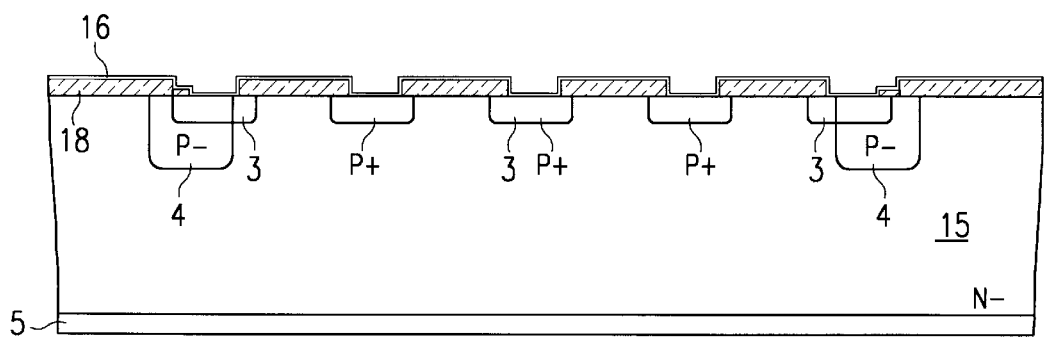

As shown in FIG. 6, the wafer is subjected to a P+ implant, such as B$^{11}$ ($5\times10^{15}$ atoms/cm$^3$, 25 keV) to form P+ regions 3. This may be followed by well known diffusion techniques. Oxide layer 15 is thus formed over the wafer.

Figure 7:
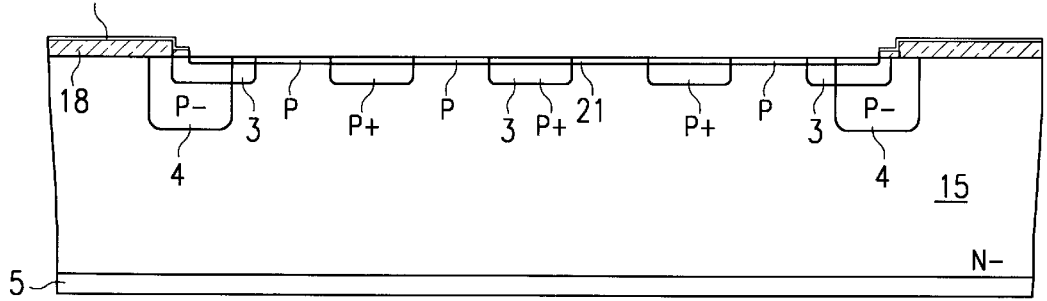

As shown in FIG. 7, a substantially large portion of layers 16 and 18 are removed. This is accomplished by using well known "mask and etch" technology. In addition P type base region 21 is formed using either implantation (boron ions, dose 6E13, energy 25 keV) or diffusion.

Figure 8:
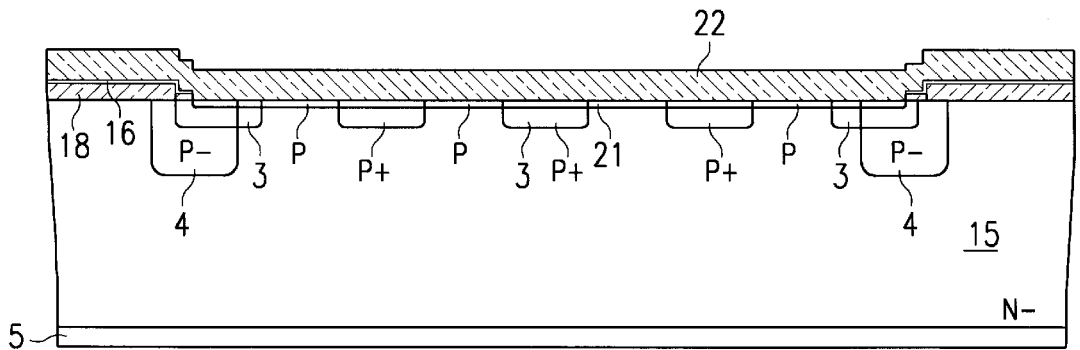
Figure 9:
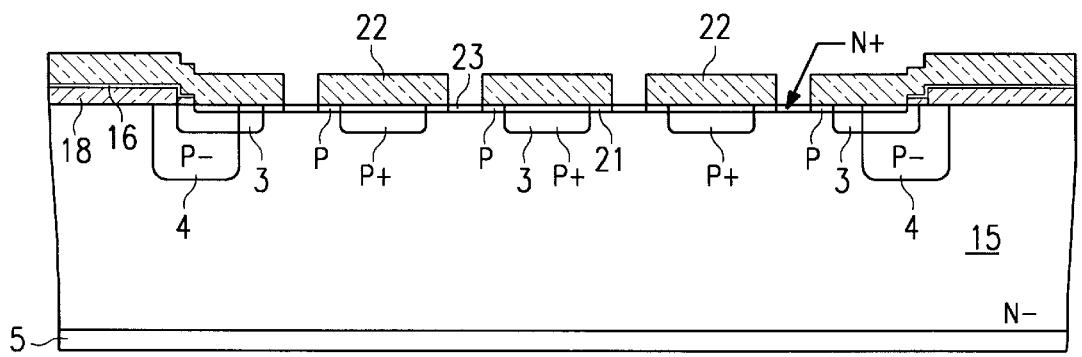

An oxide coating 22, as illustrated by FIG. 8, is then deposited onto the wafer. Portions of oxide coating 22 are removed using well known "mask and etch" technology (FIG. 9). The exposed wafer portions are then subjected to N+ implant (arsenic ions, dose $1\times10^{14}$ atoms/cm$^3$, energy 60 keV) to form emitter regions 23.

Figure 10:
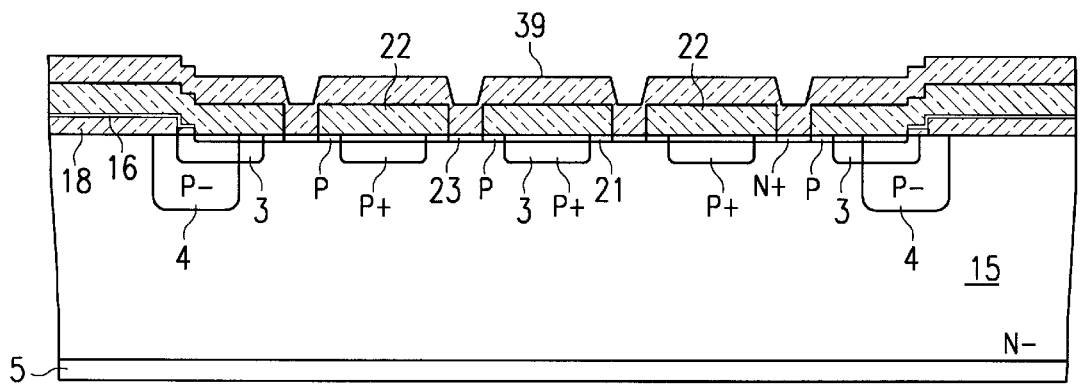
Figure 11:
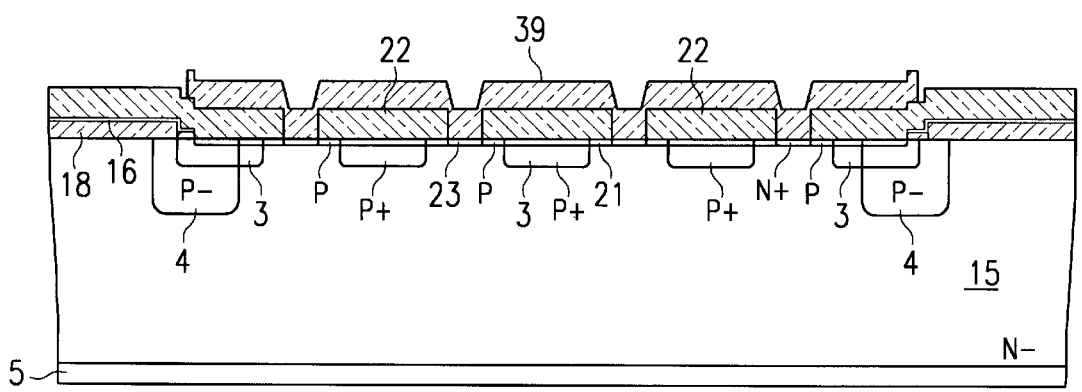
Figure 12:
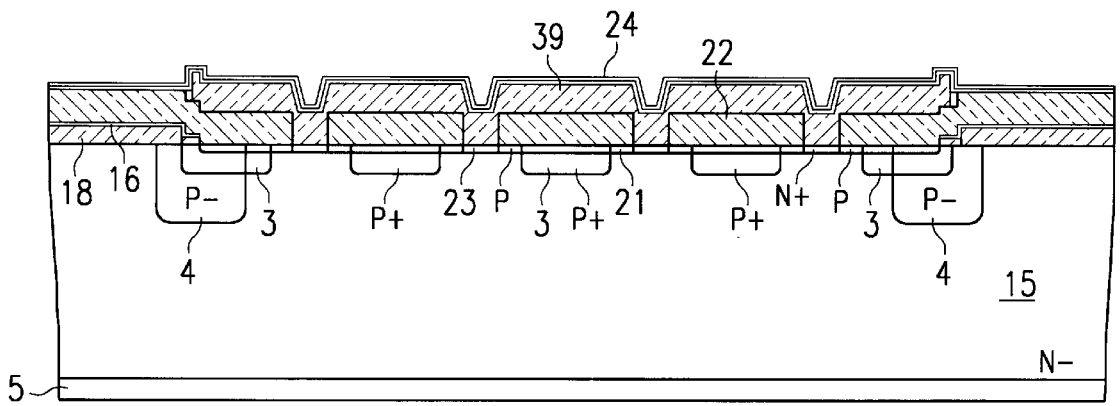

As shown in FIG. 10, the wafer is subjected to polysilicon deposition to form polysilicon layer 39. Then, as shown in FIG. 11, portions of polysilicon layer are removed. An insulation layer 24 is deposited onto the wafer (FIG. 12).

Figure 13:
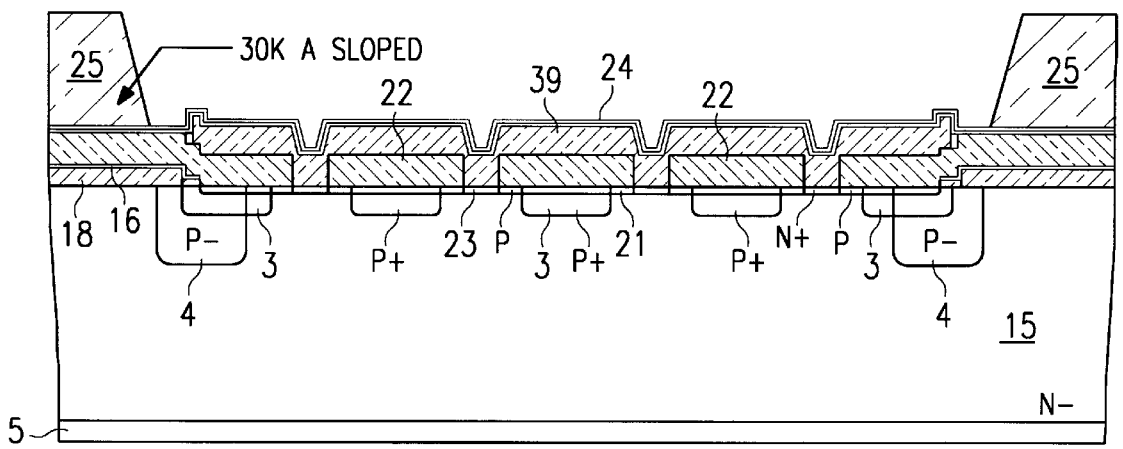

Then, as shown in FIG. 13, a thick oxide layer 25 is deposited. Oxide layer 25 is used for capacitance reduction. Contacts 32 (contact regions Z) are then formed (using mask and etch technology) before metalization layer 26 is applied (FIG. 14).

Figure 14:
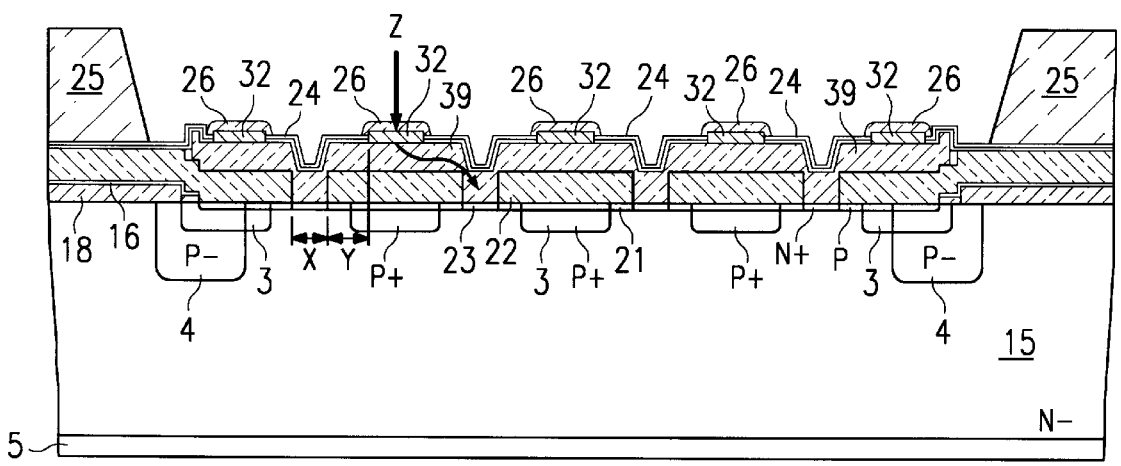
Figure 15:
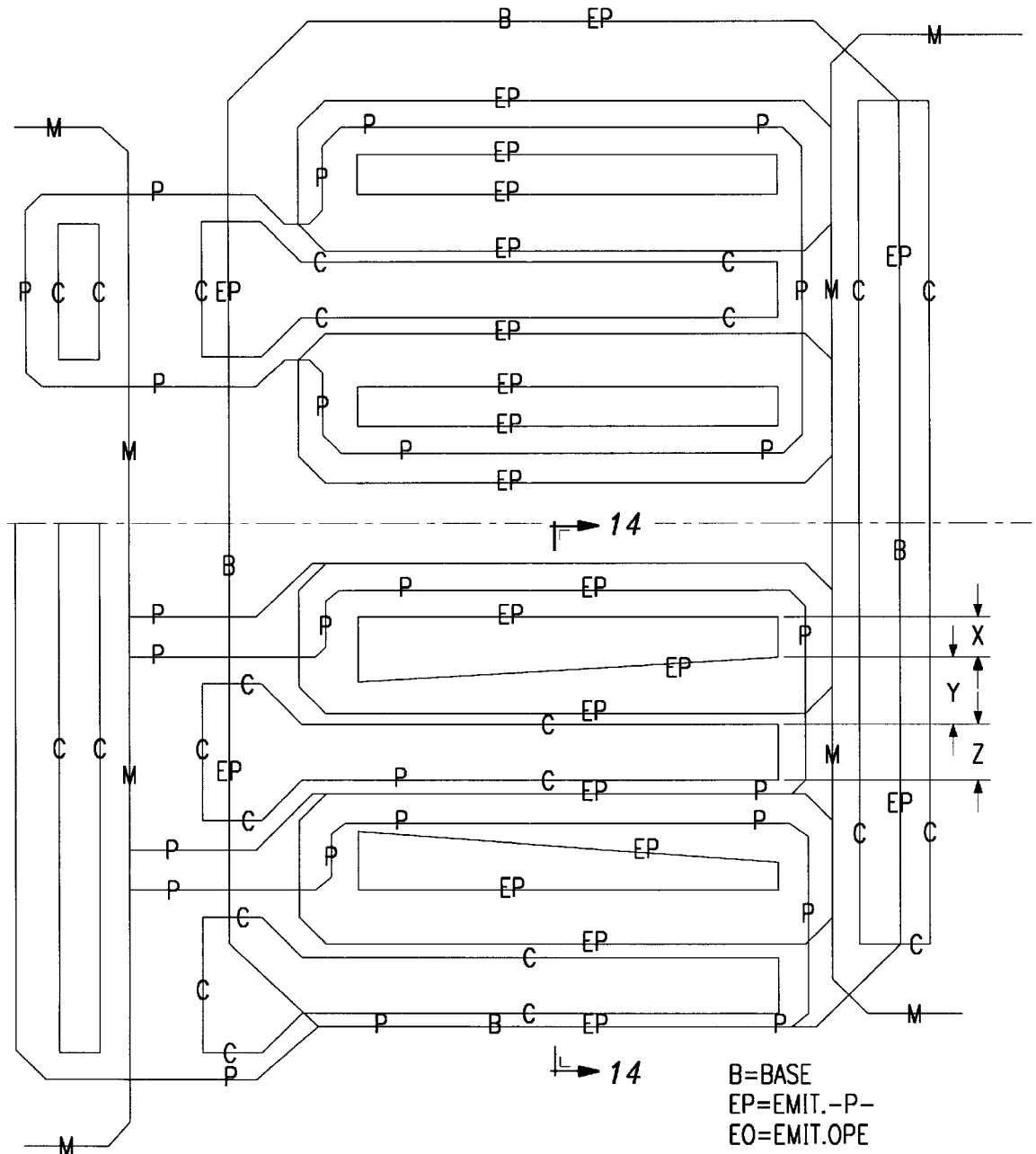
FIG. 15 is a top view of a semiconductor device at the stage of manufacture illustrated by FIG. 14. The ballast schemes are illustrated.

A top view of the semiconductor device at the stage of manufacture corresponding to FIG. 14 is illustrated by FIG. 15. FIG. 15 illustrates two exemplary embodiments of the present invention, in which two ballast schemes (above and below the centerline) are shown. FIG. 14 is a cross sectional view of FIG. 15 taken in the plane 14—14. Corresponding letters in FIGS. 14 and 15 are used to refer to corresponding structures.

Figure 1:
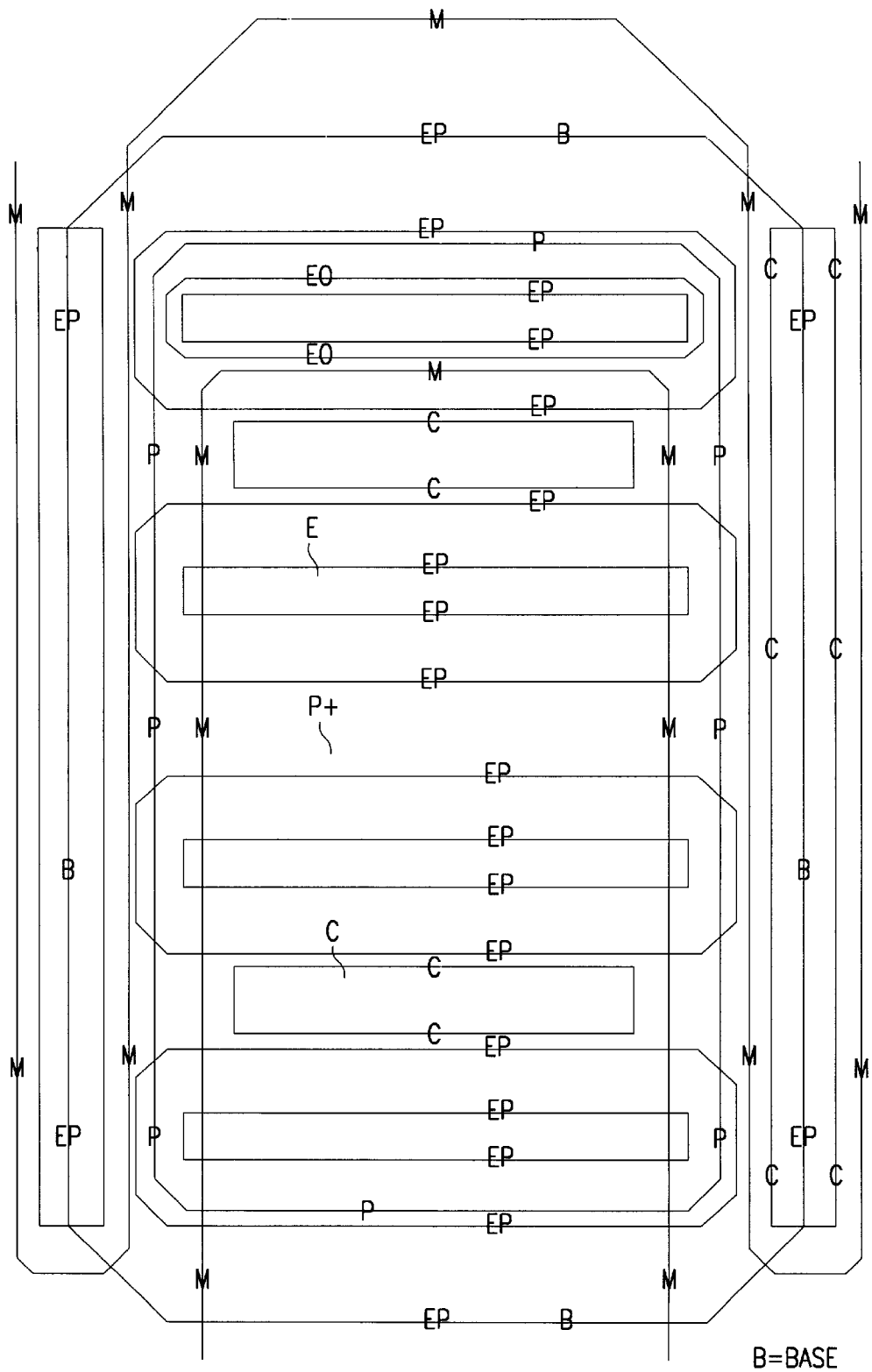
FIG. 1 is a top view of a standard overlay structure.

As shown in FIG. 14, current flows from contact region Z and then through polysilicon layer 39 until the current reaches emitter 23. As previously explained, the ballast resistance of a semiconductor device is increased by increasing the path length between contact region Z and emitter region 23. However, by increasing this path length, the width base diffusion layer 21 would also be increased. As previously described with reference to FIG. 1, by increasing the distance between contact 30 and contact 32, it is not necessary to increase the distance between contact 32 (contact region Z) and emitter region 23 in order to increase ballast resistance. Thus, the ballast resistance can be increased without adversely affecting the figure of merit of the semiconductor device.

The exemplary embodiments shown in FIG. 15 include exemplary relative distances along the width of each contact relative to the emitter edges. However, these distances can be varied, in accordance with the embodiments shown in FIGS. 2a, 2b and 2c.

By varying the distance along the emitter and contact edges between the emitter and the contact, it is possible to compensate for end-to-end voltage drop along the contact metalization to the ballast resistor, effects at the ends of the emitter diffusion and thermal effects due to power generated during normal transistor operation.

It may also be desirable to purposefully design the ballast resistor to produce non-uniform emitter current flow to optimize the distribution of power dissipation. This helps to prevent hot spotting. Furthermore, by producing non-uniform emitter current flow, emitter and effects can be eliminated or minimized. In other words, by rolling off (instead of squaring off) the ends of the emitters, hot spotting is reduced.

It is also possible to develop much more complicated distance profiles to optimize device performance at a specific current density, to vary the ballast resistor width from emitter-to-emitter across a transistor, or to optimize device performance in other ways using the present invention.

Furthermore, it is possible to add virtually any level of ballasting without additional process complexity. In addition, it is also possible to allow any combination of site and emitter finger ballasting by the proper choice of the relative geometries and the resistivity of the materials used for the ballast medium. In the exemplary embodiment described above, polysilicon has been used. However, as is well known in the art, other mediums may be used, such as metals and diffused resistors.

It is possible to interchange the base and emitter feeders from the configuration shown in FIG. 15 so that the emitters are outboard and the base feeders are inboard. This allows approximately one half of the p-plus drop existing in a standard overlay of a similar base area. This is extremely useful in overlay devices since the emitter injection and peripheral utilization injection is strongly impacted by this drop. This is because injection decreases exponentially with voltage drop.

While the invention has been described in terms of an exemplary embodiment, it is contemplated that it may be practiced as outlined above with modifications within the spirit and scope of the dependent claims.

What is claimed:

1. A semiconductor device, comprising
a substrate;
a collector layer formed above said substrate;
a base layer formed above said collector layer;
a contact region;
an emitter region formed in said base layer; and
a resistive medium located above said emitter region, said resistive medium connected between said contact region and said emitter region,
said contact region including an edge and said emitter region including an edge facing each other, wherein at least a portion of said emitter region edge and at least a portion of said contact region edge are non-parallel relative to each other.

2. The semiconductor device of claim 1, wherein at least one of said portion of said emitter region edge and said portion of said contact region edge are curved.

3. The semiconductor device of claim 1, wherein at least one of said portion of said emitter region edge and said portion of said contact region edge are acutely angled relative to each other.

4. The semiconductor device of claim 1, further including:
a further contact region; and
a further resistive medium connected between said contact region and said further contact region;
wherein said resistive medium creates a ballasting effect.

5. The semiconductor device of claim 4 wherein ballast resistance of said semiconductor device is increased without decreasing the figure of merit of said device by increasing the distance between said contact region and said further contact region.

6. The semiconductor device of claim 1, wherein said contact region is laterally offset relative to said one of said plurality of emitter regions so that said resistive medium creates a lateral ballasting effect.

7. The semiconductor device according to claim 4, wherein said further resistive medium is electrically isolated from said substrate.

8. A semiconductor device, comprising:
a substrate;
a collector layer;
a base layer formed above said collector layer;
a contact region;
an insulation layer;
a plurality of active emitter regions formed in said base layer, each one of said plurality of active emitter regions formed in a respective opening in said insulation layer; and
a resistive medium connected between said contact region and one of said plurality of active emitter regions,
wherein said contact region includes an edge and said one of said plurality of emitter regions includes an edge facing each other, wherein at least a portion of said emitter region edge and at least a portion of said contact region edge are non-parallel relative to each other.

9. The semiconductor device of claim 8, wherein at least one of said portion of said emitter region edge and said portion of said contact region edge are curved.

10. The semiconductor device of claim 8, wherein at least one of said portion of said emitter region edge and said portion of said contact region are acutely angled relative to each other.

11. The semiconductor device of claim 8, further including:
   a further contact region; and
   a further resistive medium connected between said contact region and said further contact region;
   wherein said resistive medium creates a ballasting effect.

12. The semiconductor device according to claim 8, wherein said plurality of emitter regions are formed in a non-interdigitated configuration.

13. The semiconductor device according to claim 11, wherein said further resistive medium is electrically insulated from said substrate.

14. The semiconductor device of claim 11, wherein ballast resistance of said semiconductor device is increased without decreasing the figure of merit of said device by increasing the distance between said contact region and said further contact region.

15. The semiconductor device of claim 8, wherein said contact region is laterally offset relative to said one of said plurality of emitter regions so that said resistive medium creates a lateral ballasting effect.

16. A semiconductor device, comprising:
   a substrate;
   a collector layer formed above said substrate;
   a base layer formed above said collector layer;
   a contact region;
   an emitter region formed in said base layer; and
   a resistive medium located above said emitter region, said resistive medium connected between said contact region and said emitter region,
   wherein said contact region is shaped, and positioned relative to said emitter region to produce nonuniform current flow between said emitter region and said contact region along said contact region edge.

17. The semiconductor device of claim 16, wherein at least one of said portion of said emitter region edge and said portion of said contact region edge are curved.

18. The semiconductor device of claim 16, wherein at least one of said portion of said emitter region edge and said portion of said contact region edge are acutely angled relative to each other.

19. The semiconductor device of claim 16, further including:
   a further contact region; and
   a further resistive medium connected between said contact region and said further contact region;
   wherein said resistive medium creates a ballasting effect.

20. The semiconductor device of claim 19, wherein ballast resistance of said semiconductor device is increased without decreasing the figure of merit of said device by increasing the distance between said contact region and said further contact region.

21. The semiconductor device of claim 16, wherein said contact region is laterally offset relative to said one of said plurality of emitter regions so that said resistive medium creates a lateral ballasting effect.

* * * * *